United States Patent
Mihara et al.

(10) Patent No.: US 12,044,740 B2
(45) Date of Patent: Jul. 23, 2024

(54) VOLTAGE DETECTION LINE AND VOLTAGE DETECTION LINE MODULE

(71) Applicant: SANYO Electric Co., Ltd., Osaka (JP)

(72) Inventors: Hiroyuki Mihara, Osaka (JP); Takashi Inamura, Hyogo (JP); Yasumasa Kojima, Hyogo (JP); Takashi Yoshida, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 242 days.

(21) Appl. No.: 17/603,619

(22) PCT Filed: Apr. 20, 2020

(86) PCT No.: PCT/JP2020/016989
§ 371 (c)(1),
(2) Date: Oct. 14, 2021

(87) PCT Pub. No.: WO2020/218223
PCT Pub. Date: Oct. 29, 2020

(65) Prior Publication Data
US 2022/0214402 A1 Jul. 7, 2022

(30) Foreign Application Priority Data
Apr. 25, 2019 (JP) .................................. 2019-083932

(51) Int. Cl.
*G01R 31/3835* (2019.01)
*H01M 10/48* (2006.01)
(Continued)

(52) U.S. Cl.
CPC ........ *G01R 31/3835* (2019.01); *H01M 10/48* (2013.01); *H01M 10/482* (2013.01);
(Continued)

(58) Field of Classification Search
None
See application file for complete search history.

(56) References Cited

U.S. PATENT DOCUMENTS

2016/0322623 A1* 11/2016 Kim ..................... H01M 50/505
2018/0164382 A1*  6/2018 Kataoka ............... G01R 31/396
2018/0219204 A1    8/2018 Takase et al.

FOREIGN PATENT DOCUMENTS

CN    106952890 A    7/2017
JP    H05-054721 A   3/1993
(Continued)

OTHER PUBLICATIONS

English Translation of Chinese Search Report dated Jun. 6, 2023, issued in counterpart CN application No. 202080031018.1. (3 pages).
The Extended European Search Report dated May 11, 2022, issued in counterpart EP Application No. 20794738.3. (11 page).
(Continued)

*Primary Examiner* — Jas A Sanghera
(74) *Attorney, Agent, or Firm* — WHDA, LLP

(57) ABSTRACT

Provided is a voltage detection line including conductive wire and insulating film covering conductive wire, and detecting voltage of a battery in order to suppress reconduction of a disconnected voltage detection line. Conductive wire includes low-resistance part having a predetermined electrical resistance value, and high-resistance part having a higher electrical resistance value than an electrical resistance value of low-resistance part and fusing when an overcurrent flows through conductive wire. Insulating film includes high-strength part that covers low-resistance part and has a predetermined strength, and low-strength part that covers high-resistance part and has a strength lower than a strength of high-strength part.

19 Claims, 7 Drawing Sheets

(51) Int. Cl.
  *H01M 50/569*  (2021.01)
  *H01M 50/588*  (2021.01)
  *H01M 50/50*   (2021.01)
  *H01M 50/583*  (2021.01)

(52) U.S. Cl.
  CPC ....... *H01M 50/569* (2021.01); *H01M 50/588* (2021.01); *H01M 50/50* (2021.01); *H01M 50/583* (2021.01)

(56) References Cited

FOREIGN PATENT DOCUMENTS

| | | | |
|---|---|---|---|
| JP | 3409190 B2 | | 5/2003 |
| JP | 2016-152137 A | | 8/2016 |
| JP | 2016152137 A | * | 8/2016 |
| JP | 2017-027831 | | 2/2017 |
| JP | 2017-098038 A | | 6/2017 |

OTHER PUBLICATIONS

N.N.: "European Qualifying Examination 2018 Paper B", Apr. 1, 2018 (Apr. 1, 2018), pp. 1-22, XP055916755, Retrieved from the Internet: URL:https://documents.epo.org/projects/babylon/eponot.hsf/0/28619B88EF808FEAC12582440033B222/$File/Paper_B_2018_EN.pdf [retrieved on Apr. 29, 2022] ; Cited in Extended European Search Report dated May 11, 2022. (22 pages).
International Search Report of PCT application No. PCT/JP2020/016989 dated Jul. 14, 2020. .
Office Action dated Apr. 12, 2024, issued in counterpart EP application No. 20794738.3. (9 pages).

\* cited by examiner

FIG. 4
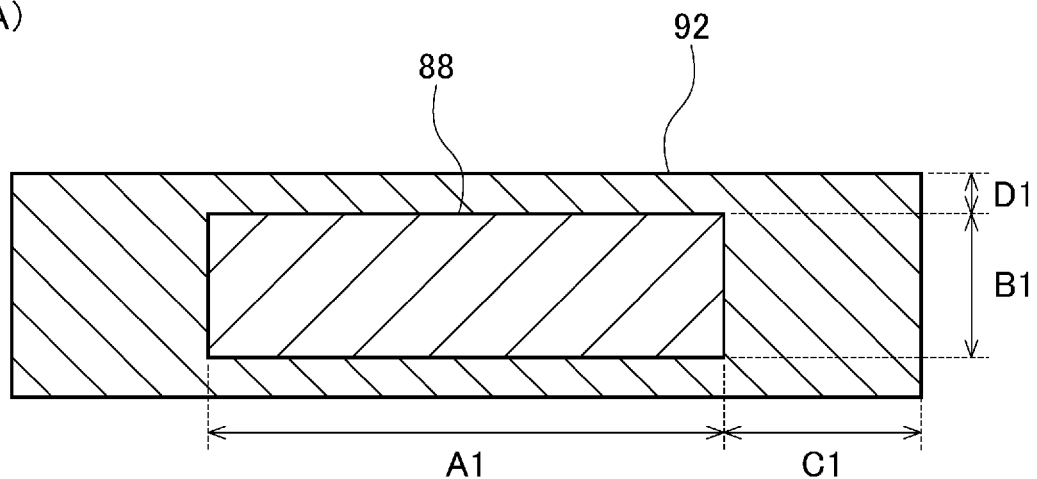
(A)
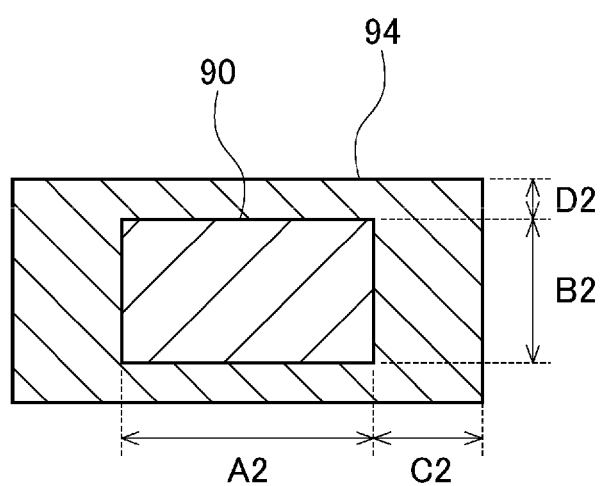
(B)

FIG. 5
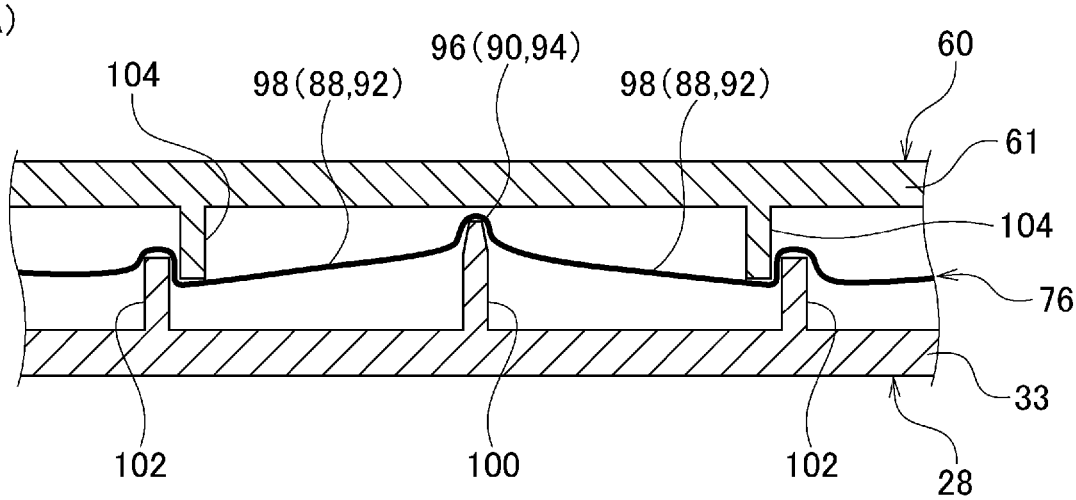
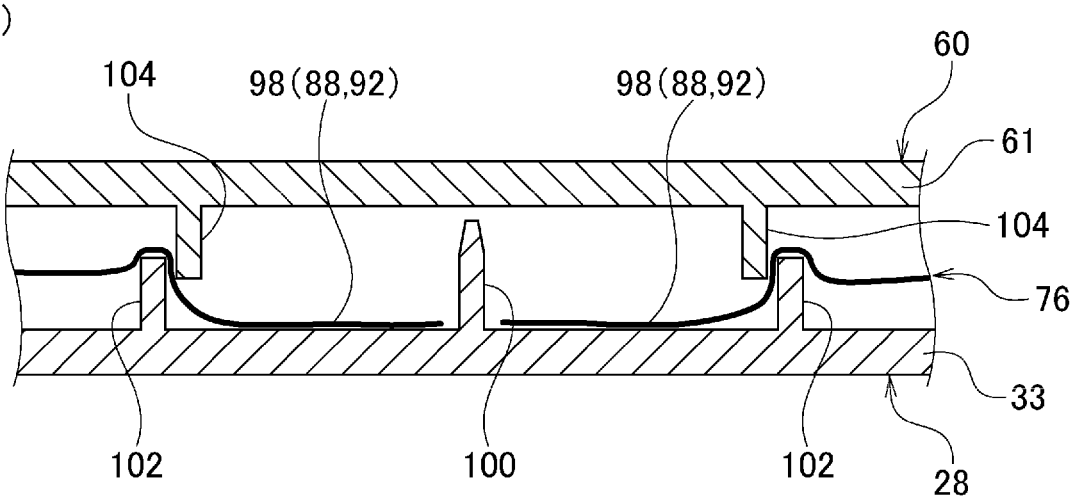

_

VOLTAGE DETECTION LINE AND VOLTAGE DETECTION LINE MODULE

CROSS-REFERENCE TO RELATED APPLICATIONS

This application is a U.S. national stage application of the PCT International Application No. PCT/JP2020/016989 filed on Apr. 20, 2020, which claims the benefit of foreign priority of Japanese patent application No. 2019-083932 filed on Apr. 25, 2019, the contents all of which are incorporated herein by reference.

TECHNICAL FIELD

The present invention relates to a voltage detection line and a voltage detection line module.

BACKGROUND ART

For example, known examples of a power source that requires high output voltage, such as for a vehicle, include a battery module in which a plurality of batteries is electrically connected. In such a battery module, neighboring batteries are electrically connected with each other via a bus bar. Further, for example, as disclosed in Patent Literature 1, a voltage detection line is attached to each bus bar, and a voltage between the batteries is detected.

In a battery module provided with voltage detection lines, there is a risk that when the voltage detection lines are short-circuited, batteries connected to these voltage detection lines may be short-circuited. On the other hand, in Patent Literature 1, a current limiting element that fuses when an overcurrent flows through a voltage detection line is provided in a middle of the voltage detection line. When the current limiting element is fused when the overcurrent flows, current flow in the voltage detection line is cut off, so that a short circuit between the batteries via the voltage detection line can be suppressed.

CITATION LIST

Patent Literature

PTL 1: Unexamined Japanese Patent Publication No. 2017-27831

SUMMARY OF THE INVENTION

Technical Problem

As a result of intensive studies on a voltage detection line having a current limiting element, the inventors of the present invention have recognized that the possibility that a disconnected voltage detection line may be conducted again due to vibration from the outside, deflection of the voltage detection line, release of deflection, or the like is not zero. In order to enhance safety of a battery module, it is desirable to reduce the possibility of reconduction of the disconnected voltage detection line as much as possible.

In view of these respects, an object of the present invention is to provide a technique for suppressing reconduction of a disconnected voltage detection line.

One aspect of the present invention is a voltage detection line. The voltage detection lines include conductive wires and insulating films covering the conductive wires, and are voltage detection lines for detecting voltage of each battery. Each of the conductive wires includes a low-resistance part having a predetermined electrical resistance value, and a high-resistance part having a higher electrical resistance value than an electrical resistance value of the low-resistance part and fusing when an overcurrent flows through the conductive wire. Each of the insulating films includes a high-strength part covering the low-resistance part and having a predetermined strength, and a low-strength part covering the high-resistance part and having a strength lower than a strength of the high-strength part.

Another aspect of the present invention is a voltage detection line module. The voltage detection line module includes voltage detection lines of the above aspect and a support plate that supports the voltage detection lines.

It should be noted that any combination of the above components and conversions of the expression of the present invention between methods, devices, systems and the like are also effective as aspects of the present invention.

According to the present invention, it is possible to suppress reconduction of a disconnected voltage detection line.

BRIEF DESCRIPTION OF DRAWINGS

FIG. 4(A) is a cross-sectional view taken along line A-A in FIG. 3. FIG. 4(B) is a cross-sectional view taken along line B-B of FIG. 3.

FIGS. 5(A) and 5(B) are cross-sectional views of a part of the voltage detection line module according to the exemplary embodiment.

DESCRIPTION OF EMBODIMENTS

Figure 1:
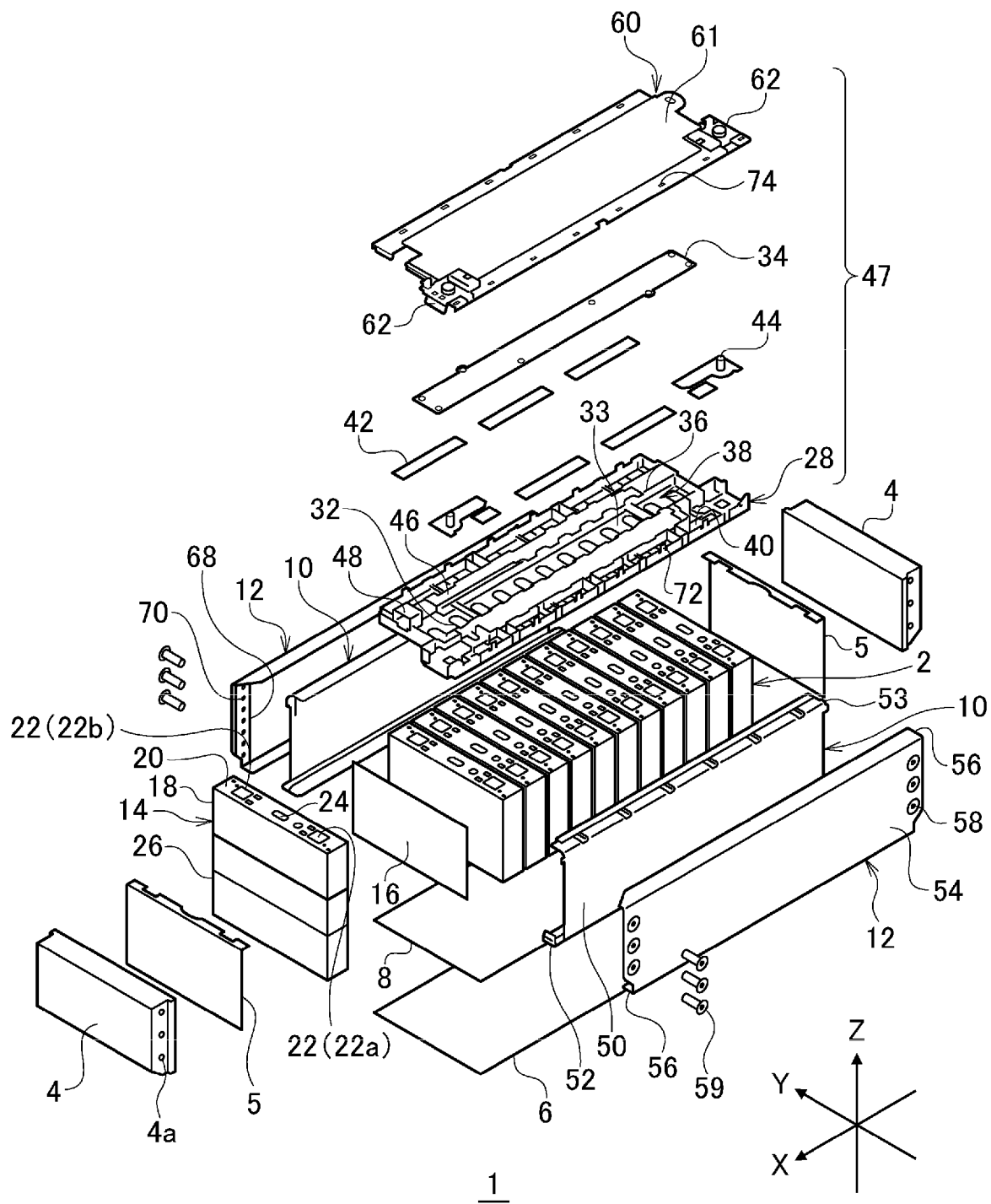
FIG. 1 is an exploded perspective view of a battery module on which voltage detection lines according to an exemplary embodiment are mounted.

Hereinafter, the present invention will be described based on a preferred exemplary embodiment with reference to the drawings. The exemplary embodiments are not intended to limit the invention but are examples, and all features described in the exemplary embodiments and combinations thereof are not necessarily essential to the invention. The same or equivalent components, members, and processes illustrated in the drawings shall be designated by the same reference numerals, and redundant description will be omitted as appropriate. Further, the scales and shapes of the parts illustrated in the drawings are determined for convenience in order to facilitate the description, and should not be interpreted as limitation unless otherwise mentioned. In addition, terms such as "first" and "second", used in the present specification or claims do not represent any order or importance unless otherwise specified, but are intended to distinguish one configuration from another configuration. Further, in each drawing, some members that are not important for describing the exemplary embodiments are omitted.

FIG. 1 is an exploded perspective view of a battery module on which voltage detection lines according to an exemplary embodiment is mounted. In FIG. 1, output terminals 22, bus bars 42, and voltage detection lines 46 are simplified. Battery module 1 includes battery stack 2, a pair of end plates 4, cooling plate 6, heat conductive layer 8, side separators 10, constraining members 12, support plate 28, voltage detection lines 46, and cover plate 60.

Battery stack 2 includes a plurality of batteries 14 and inter-cell separators 16. Each of batteries 14 is a chargeable secondary battery such as a lithium ion battery, a nickel-hydrogen battery, or a nickel-cadmium battery, for example. Each of batteries 14 is a so-called prismatic battery, and has exterior can 18 having a flat rectangular parallelepiped shape. Exterior can 18 has a substantially rectangular opening not illustrated in the drawing on one surface of the exterior can. An electrode assembly, an electrolyte and the like are housed in exterior can 18 through the opening. Sealing plate 20 that closes the opening of exterior can 18 is disposed in the opening.

Output terminal 22 of a positive electrode is disposed on sealing plate 20 at a position close to one end of the sealing plate in a longitudinal direction, and output terminal 22 of a negative electrode is disposed on sealing plate 20 at a position close to the other end. The pair of output terminals 22 is electrically connected to the corresponding one of a positive electrode plate and a negative electrode plate, constituting the electrode assembly. Hereinafter, output terminal 22 of the positive electrode is referred to as positive-electrode terminal 22a, and output terminal 22 of the negative electrode is referred to as negative-electrode terminal 22b as appropriate. When there is no need to distinguish polarities of output terminals 22 from each other, positive-electrode terminal 22a and negative-electrode terminal 22b are collectively referred to as output terminals 22.

Exterior can 18, sealing plate 20, and output terminals 22 are electric conductors and are made of metal, for example. Sealing plate 20 and the opening of exterior can 18 are joined to each other by, for example, laser welding. Respective output terminals 22 are inserted into through-holes (not illustrated) formed in sealing plate 20. A seal member (not illustrated) having an insulating property is interposed between respective output terminals 22 and respective through-holes.

In the description of the present exemplary embodiment, for convenience, sealing plate 20 forms an upper surface of battery 14, and a bottom surface of exterior can 18 disposed on a side opposite to sealing plate 20 forms a lower surface of battery 14. Battery 14 has two main surfaces that connect the upper surface and the lower surface of battery 14 to each other. The main surfaces are surfaces that have the largest area among six surfaces of battery 14. The main surfaces are long side surfaces that are connected to long sides of the upper surface and long sides of the lower surface. Two remaining surfaces other than the upper surface, the lower surface, and two main surfaces form side surfaces of battery 14. These side surfaces are a pair of short side surfaces that is connected to short sides of the upper surface and short sides of the lower surface.

For convenience, in battery stack 2, surfaces of batteries 14 closer to an upper surface are referred to as an upper surface of battery stack 2, surfaces of batteries 14 closer to a lower surface are referred to as a lower surface of battery stack 2, and surfaces of batteries 14 closer to side surface are referred to as side surfaces of battery stack 2. These directions and positions are defined for convenience unless otherwise specified. Therefore, for example, the portion defined as the upper surface in the present invention does not always mean that the portion defined as the upper surface is positioned above the portion defined as the lower surface.

Valve 24 is disposed on sealing plate 20 between the pair of output terminals 22. Valve 24 is also referred to as a safety valve. Valve 24 is a mechanism for releasing a gas in each battery 14. Valve 24 is configured to release an internal gas by opening valve 24 when an inner pressure of exterior can 18 is increased to a predetermined value or more. For example, valve 24 includes: a thin part that is formed on a part of sealing plate 20 and is thinner than other parts of valve 24; and a linear groove formed on a surface of the thin part. In this configuration, when an internal pressure of exterior can 18 increases, valve 24 is opened by tearing the thin wall part with the groove as a tearing starting point. Valve 24 of each battery 14 is connected to exhaust duct 38 described later, and the gas inside the batteries are discharged from valves 24 to exhaust duct 38.

Each battery 14 has insulating film 26. Insulating film 26 is, for example, a cylindrical shrink tube, and is heated after exterior can 18 is made to pass through the inside of insulating film 26. Accordingly, insulating film 26 shrinks and covers two main surfaces, two side surfaces, and a bottom surface of exterior can 18. Insulating film 26 can prevent a short circuit between batteries 14 disposed adjacently to each other or between battery 14 and end plate 4 or constraining member 12.

The plurality of batteries 14 are stacked to each other at a predetermined interval such that the main surfaces of batteries 14 disposed adjacently to each other face each other. Note that, the term "stack" corresponds to arranging a plurality of members in any one direction. Therefore, stacking batteries 14 also includes arranging the plurality of batteries 14 in the horizontal direction. In the present exemplary embodiment, batteries 14 are horizontally stacked. Accordingly, stacking direction X of batteries 14 is a direction of extending in the horizontal direction. Hereinafter, when appropriate, a direction that is horizontal and is perpendicular to stacking direction X is referred to as horizontal direction Y, and a direction that is perpendicular to stacking direction X and horizontal direction Y is referred to as vertical direction Z.

Respective batteries 14 are disposed in a state where output terminals 22 are directed in a same direction. In the present exemplary embodiment, respective batteries 14 are disposed in a state where output terminals 22 are directed upward in the vertical direction. With respect to respective batteries 14, when batteries 14 disposed adjacently to each other are connected in series, batteries 14 are stacked in a state where positive-electrode terminal 22a of one battery 14 and negative-electrode terminal 22b of another battery 14 are disposed adjacently to each other. When batteries 14 disposed adjacently to each other are connected in parallel, batteries 14 are stacked to each other in a state where positive-electrode terminal 22a of one battery 14 and positive-electrode terminal 22a of another battery 14 are disposed adjacently to each other.

Inter-cell separator 16 is also referred to as an insulating spacer, and is formed of a resin sheet having an insulating property, for example. Examples of the resin constituting inter-cell separator 16 include thermoplastic resins such as polypropylene (PP), polybutylene terephthalate (PBT), polycarbonate (PC), and Noryl (registered trademark) resin (modified-PPE). Inter-cell separator 16 is disposed between two batteries 14 disposed adjacent to each other to electrically insulate two batteries 14 from each other.

Battery stack 2 is sandwiched between the pair of end plates 4 in stacking direction X of batteries 14. The pair of end plates 4 is disposed at both ends of battery stack 2 in stacking direction X along which batteries 14 are stacked.

The pair of end plates 4 is disposed adjacently to batteries 14 positioned at both ends in stacking direction X, via external end separator 5. External end separator 5 can be made of the same resin material as inter-cell separator 16. Each end plate 4 is a metal plate made of metal such as iron, stainless steel, or aluminum. By interposing external end separator 5 between end plate 4 and battery 14, end plate 4 and battery 14 are electrically insulated from each other. Each end plate 4 has fastening holes 4a on two surfaces that are directed in horizontal direction Y.

Support plate 28 is placed on the upper surface of battery stack 2. Support plate 28 is a plate-like member that supports voltage detection lines 46. Voltage detection lines 46 are members for detecting voltage of each battery 14. Voltage detection lines 46 of the present exemplary embodiment detect voltages of the plurality of stacked batteries 14.

Support plate 28 covers the upper surface of battery stack 2, that is, surfaces on which each valve 24 of respective batteries 14 is disposed. Support plate 28 has a plurality of openings 32 through which a plurality of valves 24 are exposed at positions corresponding to valves 24 formed on respective batteries 14. The plurality of openings 32 are formed in base plate 33 extending along the upper surface of battery stack 2. Support plate 28 includes exhaust duct 38 that temporarily stores the gas ejected from respective batteries 14. Accordingly, support plate 28 also functions as a so-called duct plate. Exhaust duct 38 extends in stacking direction X of batteries 14 and is connected to valves 24 of respective batteries 14. Respective valves 24 communicate with exhaust duct 38 through openings 32.

Exhaust duct 38 is defined by: first wall part 34 that covers the upper sides of the plurality of openings 32; and a pair of second wall parts 36 which surrounds the sides of respective openings 32. The pair of second wall parts 36 is arranged in horizontal direction Y with the plurality of openings 32 interposed therebetween. First wall part 34 faces each valve 24. The pair of second wall parts 36 protrudes from base plate 33 toward cover plate 60, and forms both side surfaces of exhaust duct 38. First wall part 34 is fixed to upper ends of the pair of second wall parts 36 to form a top surface of exhaust duct 38.

Support plate 28 has openings 40 through which output terminals 22 are exposed at positions corresponding to output terminals 22 of respective batteries 14. Bus bars 42 are placed on respective openings 40. The plurality of bus bars 42 are supported by support plate 28. Accordingly, support plate 28 also functions as a so-called bus bar plate. Bus bars 42 placed in respective openings 40 electrically connect output terminals 22 of batteries 14 disposed adjacently to each other.

Support plate 28 of the present exemplary embodiment is made of a resin such as polypropylene (PP), polybutylene terephthalate (PBT), polycarbonate (PC), and Noryl (registered trademark) resin (modified PPE) except for first wall part 34. First wall part 34 is made of metal such as iron or aluminum. The pair of second wall parts 36 is integrally formed with base plate 33 by molding. First wall part 34 is fixed to the pair of second wall parts 36 by fastening members (not illustrated) such as screws.

Each of bus bars 42 is a substantially strip-shaped member made of metal such as copper or aluminum. One end of bus bar 42 is connected to output terminal 22 of one battery 14, and the other end of bus bar 42 is connected to output terminal 22 of another battery 14. Bus bar 42 and output terminal 22 are bonded to each other by, for example, laser welding or ultrasonic bonding. With respect to bus bars 42, output terminals 22 having the same polarity in a plurality of batteries 14 disposed adjacently to each other may be connected in parallel by bus bars 42 to form a battery block, and these battery blocks may be connected in series by bus bars 42. Bus bars 42 connected to output terminals 22 of batteries 14 positioned at both ends in stacking direction X each have external connection terminal 44. External connection terminal 44 is connected to an external load (not illustrated).

Voltage detection lines 46 placed on support plate 28 are electrically connected to the plurality of bus bars 42 to detect voltage of each battery 14. Voltage detection lines 46 include a plurality of conductive wires 80 (refer to FIG. 2). One end of each conductive wire 80 is connected to each bus bar 42, and the other end is connected to connector 48. Connector 48 is connected to an external battery ECU (not illustrated) or the like. Battery ECU controls detection of a voltage or the like of each battery 14, charging and discharging of each battery 14, and the like.

Cooling plate 6 has a flat plate shape extending in stacking direction X and in horizontal direction Y, and is made of a material having high thermal conductivity such as aluminum. Cooling plate 6 is connected to battery stack 2 in a heat-exchangeable manner to cool respective batteries 14. Battery stack 2 is placed on cooling plate 6 such that the lower surface of battery stack 2 faces a cooling plate 6. Cooling plate 6 may be connected to the outside of battery module 1 in a heat-exchangeable manner. A flow path through which a refrigerant such as water or ethylene glycol flows may be disposed in cooling plate 6.

Heat conductive layer 8 is a member having an insulating property which is interposed between battery stack 2 and cooling plate 6. Heat conductive layer 8 covers the entire bottom surface of battery stack 2. Heat conductive layer 8 can be formed of, for example, a known resin sheet having good thermal conductivity, such as an acrylic rubber sheet or a silicone rubber sheet. In addition, heat conductive layer 8 may be made of a known adhesive agent, grease, or the like having a good thermal conductivity and an insulating property. When exterior can 18 is sufficiently insulated by insulating film 26 or the like, heat conductive layer 8 may not have the insulating property.

Side separators 10 are members that have an insulating property and insulate constraining members 12 and battery stack 2 from each other. In the present exemplary embodiment, the pair of side separators 10 is arranged in horizontal direction Y. Battery stack 2, the pair of end plates 4, cooling plate 6, and heat conductive layer 8 are disposed between the pair of side separators 10. Each of side separators 10 is made of, for example, a resin having an insulating property. Examples of the resin constituting side separators 10 include the same thermoplastic resin as the Inter-cell separator 16.

Side separator 10 of the present exemplary embodiment has first part 50, second part 52, and third part 53. First part 50 has a rectangular flat plate shape, and extends in stacking direction X of batteries 14 along a side surface of battery stack 2. Second part 52 has a strip shape extending in stacking direction X, and protrudes from a lower side of first part 50 toward a battery stack 2. Third part 53 has a strip shape extending in stacking direction X, and protrudes from an upper side of first part 50 toward the battery stack 2. Battery stack 2, cooling plate 6, and heat conductive layer 8 are disposed between second part 52 and third part 53.

Constraining members 12 are also referred to as bind bars, and are elongated members that are long in stacking direction X of batteries 14. In the present exemplary embodiment, a pair of constraining members 12 is arranged in horizontal direction Y. Each of constraining members 12 is made of metal. Examples of metal constituting constraining members 12 include iron and stainless steel. Battery stack 2, the pair of end plates 4, cooling plate 6, heat conductive layer 8, and the pair of side separators 10 are disposed between the pair of constraining members 12.

In the present exemplary embodiment, each of constraining members 12 includes flat surface part 54 and a pair of arm parts 56. Flat surface part 54 has a rectangular shape, and extends in stacking direction X along the side surface of battery stack 2. The pair of arm parts 56 protrudes toward a battery stack 2 from ends of flat surface part 54 on both sides in vertical direction Z. Battery stack 2, cooling plate 6, heat conductive layer 8, and side separators 10 are disposed between the pair of arm parts 56.

Contact plate 68 is fixed to regions of flat surface part 54 that face respective end plates 4 by welding or the like. Contact plate 68 is provided with through-holes 70 at positions corresponding to fastening holes 4a of end plate 4. Flat surface part 54 has through-holes 58 at positions corresponding to through-holes 70 of contact plate 68.

By making the pair of end plates 4 engage with flat surface parts 54 of respective constraining members 12, the plurality of batteries 14 are sandwiched between end plates 4 in stacking direction X. Specifically, battery stack 2 is formed by alternately arranging the plurality of batteries 14 and the plurality of inter-cell separators 16, and such battery stack 2 is sandwiched between the pair of end plates 4 with external end separators 5 interposed between battery stack 2 and end plates 4 in stacking direction X. Heat conductive layer 8 and cooling plate 6 are disposed on the lower surface of battery stack 2. In such a state, battery stack 2, the pair of end plates 4, cooling plate 6, and heat conductive layer 8 are sandwiched between the pair of side separators 10 in horizontal direction Y. Further, the pair of constraining members 12 sandwiches the whole body in horizontal direction Y from the outside of the pair of side separators 10.

The pair of end plates 4 and the pair of constraining members 12 are aligned with each other such that fastening holes 4a, through-holes 70, and through-holes 58 overlap with each other. Fastening members 59 such as screws are made to pass through through-holes 58 and through-holes 70 and are made to threadedly engage with fastening holes 4a. With such a configuration, the pair of end plates 4 and the pair of constraining members 12 are fixed to each other. By making the pair of end plates 4 and the pair of constraining members 12 engage with each other, the plurality of batteries 14 are fastened to each other and are constrained in stacking direction X.

Constraining members 12 sandwich the plurality of batteries 14 in stacking direction X. Constraining members 12 also sandwich battery stack 2, heat conductive layer 8, and cooling plate 6 in the arrangement direction of battery stack 2, heat conductive layer 8, and cooling plate 6. Battery stack 2, heat conductive layer 8, and cooling plate 6 are sandwiched between the pair of arm parts 56 of each constraining member 12 in vertical direction Z. That is, constraining members 12 have both a function of fastening the plurality of batteries 14 and a function of fastening battery stack 2 and cooling plate 6.

In a state where the pair of constraining members 12 is fixed to the pair of end plates 4, first part 50 of side separator 10 is interposed between the side surface of battery stack 2 and flat surface part 54 of constraining member 12. With such a configuration, the side surfaces of respective batteries 14 and flat surface part 54 are electrically insulated from each other. Second part 52 of side separator 10 is interposed between cooling plate 6 and arm part 56 of constraining member 12 on a lower side. With such a configuration, cooling plate 6 and arm part 56 of constraining member 12 on the lower side are electrically insulated from each other. Third part 53 of side separator 10 is interposed between the upper surface of battery stack 2 and arm part 56 of constraining member 12 on an upper side. With such a configuration, the upper surfaces of respective batteries 14 and arm part 56 of constraining member 12 on the upper side are electrically insulated from each other.

As an example, after assembling of these constituent elements is completed, support plate 28 is placed on battery stack 2. Support plate 28 is fixed to battery stack 2 by making third parts 53 of the pair of side separators 10 engage with support plate 28. Bus bar 42 is placed on output terminal 22 of each battery 14. Voltage detection lines 46 are placed on support plate 28. Subsequently, conductive wires 80 of voltage detection lines 46 are electrically connected to each bus bar 42. In addition, each bus bar 42 is electrically connected to output terminals 22.

Cover plate 60 is placed on an upper surface of support plate 28. The cover plate 60 is a plate-shaped member that is placed on support plate 28 and covers voltage detection lines 46. Cover plate 60 according to the present exemplary embodiment is a so-called top cover that forms a portion of an outer shell of battery module 1, specifically, an upper surface of battery module 1. Cover plate 60 prevents dew condensation water, dust, or the like from being brought into contact with output terminals 22, valves 24 of batteries 14, bus bars 42, voltage detection lines 46, and the like.

Cover plate 60 is made of a resin having an insulating property such as polypropylene (PP), polybutylene terephthalate (PBT), polycarbonate (PC), and Noryl (registered trademark) resin (modified PPE). Cover plate 60 has insulating cover parts 62 at positions overlapping with external connection terminals 44 in vertical direction Z. In a state where cover plate 60 is placed on support plate 28, external connection terminals 44 are covered by insulating cover parts 62.

Both ends of cover plate 60 in horizontal direction Y are fixed to support plate 28. Specifically, support plate 28 of the present exemplary embodiment has a plurality of engaging claws 72 at both ends of support plate 28 in horizontal direction Y in a state where the plurality of engaging claws 72 are disposed at an interval in stacking direction X. Further, cover plate 60 has engagement holes 74 at positions overlapping respective engaging claws 72 as viewed in vertical direction Z in base plate 61 extending along the upper surface of battery stack 2. When cover plate 60 is placed on support plate 28, each engaging claw 72 is inserted into each engagement hole 74. As a result, both ends of cover plate 60 in horizontal direction Y are fixed to support plate 28 by snap-fitting. Support plate 28, voltage detection lines 46, and cover plate 60 constitute voltage detection line module 47.

Figure 2:
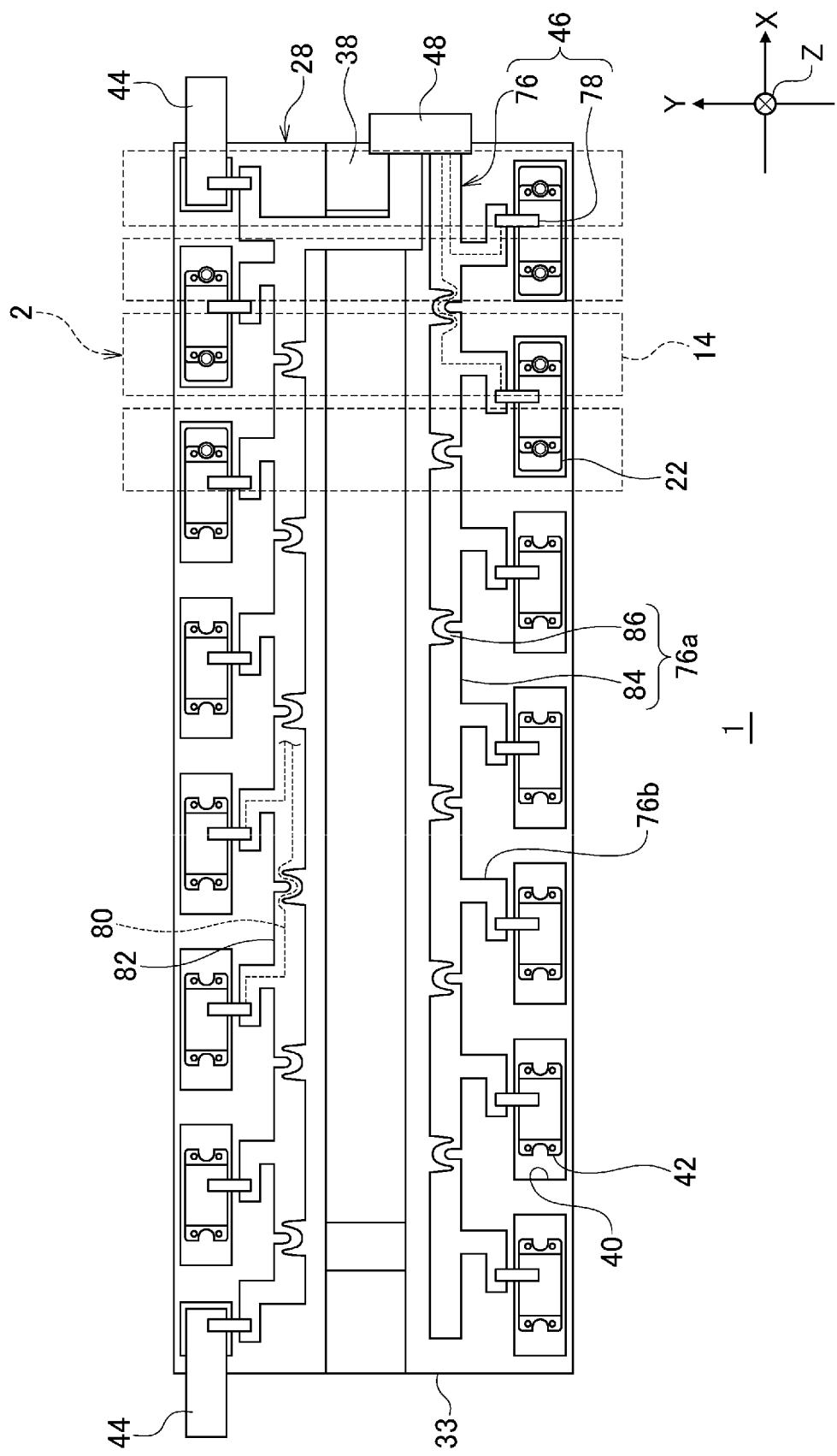
FIG. 2 is a plan view of the battery module.

FIG. 2 is a plan view of battery module 1. In FIG. 2, only some of batteries 14 and only some of conductive wires 80 are indicated by broken lines. Illustration of side separators 10, constraining members 12, and cover plate 60 are omitted.

Voltage detection lines 46 include detection line main body 76 and a plurality of tab terminals 78. Detection line main body 76 includes stems 76a that macroscopically extend in stacking direction X of batteries 14, and a plurality of branches 76b that branch from stems 76a toward bus bars 42. An end of stem 76a is connected to connector 48, and an end of each branch 76b extends to a vicinity of each bus bar 42.

Detection line main body 76 includes a plurality of conductive wires 80 associated with each bus bar 42 and insulating films 82 covering the plurality of conductive wires 80. That is, a set of voltage detection lines 46 of the present exemplary embodiment is a flexible printed circuit (FPC) board. Voltage detection lines 46 constituted by the FPC are placed in an orientation such that the thickness direction is parallel to vertical direction Z and the width direction and the length direction are parallel to an XY plane including stacking direction X and horizontal direction Y, and is placed on support plate 28. The plurality of conductive wires 80 are made of a conductive material such as copper. Insulating films 82 are made of a resin such as polyimide (PI) or polyethylene naphthalate (PEN). One end of each conductive wire 80 is connected to connector 48, and the other end extends to the vicinity of corresponding bus bar 42. Therefore, each conductive wire 80 extends from stem 76a to branch 76b.

For example, detection line main body 76 is obtained by bonding a metal foil to a surface of insulating film 82, etching the metal foil to form a wiring pattern, that is, forming conductive wires 80, and covering conductive wires 80 with insulating film 82. Conductive wires 80 can also be formed on insulating film 82 by applying a material constituting conductive wires 80 to insulating film 82 by inkjet or the like.

Each tab terminal 78 is a belt-shaped metal member and electrically connects an end of each conductive wire 80 and each bus bar 42. One end of each tab terminal 78 is placed on bus bar 42, and is joined to bus bar 42 by, for example, laser welding or ultrasonic joining. The other end of each tab terminal 78 is joined to conductive wire 80 by, for example, soldering. As a result, each bus bar 42 and connector 48 are electrically connected. In addition, some of conductive wires 80 electrically connect external connection terminal 44 and connector 48.

Tab terminal 78 is joined to a substantially central part of bus bar 42 in stacking direction X. Alternatively, tab terminal 78 is joined to a region of bus bar 42 that straddles two batteries 14. As a result, a displacement amount of the joint between tab terminal 78 and bus bar 42 due to expansion and contraction of each battery 14 can be reduced. Therefore, the connection state between tab terminal 78 and bus bar 42 can be more stably maintained.

Detection line main body 76 has first regions 84 extending in stacking direction X of batteries 14 and second regions 86 extending in a direction intersecting stacking direction X. In the present exemplary embodiment, each second region 86 is provided in stem 76a. Stem 76a has a structure in which a plurality of first regions 84 and a plurality of second regions 86 are alternately connected. In stacking direction X, each second region 86 is disposed between two adjacent branches 76b.

Each battery 14 may expand and contract with use. When each battery 14 expands and contracts, bus bar 42 fixed to output terminal 22 of each battery 14 may be displaced in stacking direction X. In this case, the plurality of branches 76b fixed to each bus bar 42 can be relatively displaced in stacking direction X. Second region 86 extending in the direction intersecting stacking direction X can be more flexibly deformed following a displacement of branch 76b as compared with first region 84 extending in stacking direction X. Specifically, second region 86 is configured to extend in the direction intersecting stacking direction X. Thus, when a load in stacking direction X is applied to detection line main body 76, second region 86 is subject to bending deformation or shear deformation, thereby allowing a displacement of branch 76b in stacking direction X. In order to more effectively follow the displacement of branch 76b, as illustrated in FIG. 2, a structure having a curved outer shape, in other words, an arch-shaped structure is preferably included in second region 86. In this configuration, when a load in stacking direction X is applied to detection line main body 76, second region 86 is deformed such that both ends of second region 86 are separated from each other. Therefore, each second region 86 can function as a displacement absorbing part that absorbs a relative displacement of two branches 76b adjacently arranged across second region 86 in stacking direction X. Accordingly, the stability of electrical connection between each bus bar 42 and voltage detection lines 46 can be enhanced.

Figure 3:
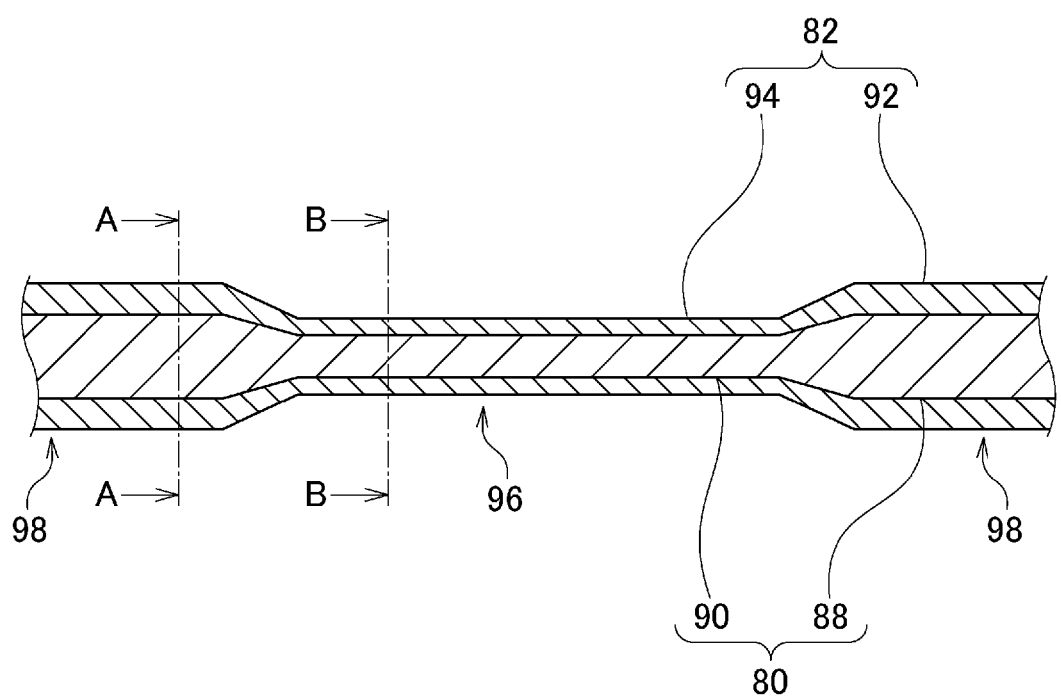
FIG. 3 is a cross-sectional view of a conductive wire in a second region.

FIG. 3 is a cross-sectional view of conductive wire 80 in second region 86. FIG. 4(A) is a cross-sectional view taken along line A-A of FIG. 3. FIG. 4(B) is a cross-sectional view taken along line B-B of FIG. 3. FIG. 3 illustrates a cross section parallel to the XY plane. Each of conductive wires 80 includes low-resistance parts 88 and high-resistance part 90. Each of low-resistance parts 88 is a part having a lower electrical resistance value than an electrical resistance value of high-resistance part 90. High-resistance part 90 is a part having a higher electrical resistance value than an electrical resistance value of low-resistance part 88. That is, low-resistance part 88 has a relatively low electrical resistance value, and high-resistance part 90 has a relatively high electrical resistance value.

Low-resistance part 88 includes a large cross-sectional area having a relatively large cross-sectional area orthogonal to the extending direction of conductive wire 80, that is, a current flowing direction. On the other hand, high-resistance part 90 includes a small cross-sectional area having a relatively small cross-sectional area orthogonal to the extending direction of conductive wire 80. In the present exemplary embodiment, low-resistance part 88 has relatively large width A1 (dimension in XY plane direction), and high-resistance part 90 has relatively small width A2. In addition, thickness B1 (dimension in vertical direction Z) of low-resistance part 88 and thickness B2 of high-resistance part 90 have a same size. Note that the cross-sectional area of low-resistance part 88 may be made larger than the cross-sectional area of high-resistance part 90 by making thickness B1 of low-resistance part 88 relatively large and making thickness B2 of high-resistance part 90 relatively small. High-resistance part 90 is preferentially fused when an overcurrent flows through conductive wire 80. Accordingly, the overcurrent flowing through conductive wire 80 can be immediately cut off.

Insulating film 82 includes high-strength part 92 and low-strength part 94. High-strength part 92 covers low-resistance part 88. Low-strength part 94 covers high-resistance part 90. High-strength part 92 has a relatively high-strength, and low-strength part 94 has a relatively low-strength. The "strength" denotes mechanical strength or heat resistance (heat resistance strength). In the present exemplary embodiment, coating thickness C1 of high-strength part 92 in the width (XY plane direction) of low-resistance part 88 is larger than coating thickness C2 of low-strength part 94 in the width of high-resistance part 90. Since coating thickness C2 is smaller than coating thickness C1, the strength of low-strength part 94 is weaker than the strength of high-strength part 92. Coating thickness D1 of high-strength part 92 in the thickness (vertical direction Z) of low-resistance part 88 is equal to coating thickness D2 of low-strength part 94 in the thickness (vertical direction Z) of high-resistance part 90.

Note that the strength of low-strength part 94 may be made weaker than the strength of high-strength part 92 by making coating thickness D2 of low-strength part 94 smaller than coating thickness D1 of high-strength part 92. The "coating thickness" means a distance from an inner surface of insulating film 82 in contact with conductive wire 80 to an outer surface on the opposite side, and it does not matter whether "coating thickness" is in the thickness, width, or length of each voltage detection line 46. In addition, when coating thickness D2 of low-strength part 94 is made smaller than coating thickness D1 of high-strength part 92, the rigidity of low-strength part 94 can be made lower than the rigidity of high-strength part 92. Since low-strength part 94 of the present exemplary embodiment is provided in second region 86 of detection line main body 76, bending deformation and shearing deformation of second region 86 can be effectively allowed by setting the rigidity of low-strength part 94 to be lower than the rigidity of high-strength part 92.

By covering high-resistance part 90 with low-strength part 94 having a relatively low-strength, when high-resistance part 90 is fused, insulating film 82 can be more reliably cut at the fused portion. As a result, since one end side and the other end side of disconnected conductive wire 80 can be physically separated from each other, the possibility that fused conductive wire 80 conducts again can be reduced. Hereinafter, in detection line main body 76, a portion constituting high-resistance part 90 and low-strength part 94 is appropriately referred to as fusible portion 96, and a portion constituting low-resistance part 88 and high-strength part 92 is appropriately referred to as non-fusible portion 98.

High-resistance part 90 of the present exemplary embodiment is disposed in second region 86 of detection line main body 76. Since high-resistance part 90 has a smaller cross-sectional area than a cross-sectional area of low-resistance part 88, high-resistance part 90 is more easily deformed than low-resistance part 88. Therefore, by disposing high-resistance part 90 in second region 86, second region 86 can be more easily deformed. As a result, the stability of electrical connection between each bus bar 42 and voltage detection lines 46 can be further improved.

FIGS. 5(A) and 5(B) are cross-sectional views of a part of voltage detection line module 47 according to the exemplary embodiment. FIG. 5 (A) illustrates a state in which fusible portion 96 is connected. FIG. 5(B) illustrates a state in which fusible portion 96 is fused. Support plate 28 according to the present exemplary embodiment includes first protrusion 100. First protrusion 100 protrudes upward in a vertical direction from base plate 33 of support plate 28, and fusible portion 96 is placed on a tip thereof. Therefore, high-resistance part 90 of conductive wire 80 is supported from below by first protrusion 100.

Since fusible portion 96 is supported by first protrusion 100, when fusible portion 96 is fused, one end side and the other end side of the disconnected detection line main body 76 fall down by their own weight. At this time, the one end side and the other end side of detection line main body 76 are separated by first protrusion 100. That is, first protrusion 100 functions as a screen. This makes it possible to more reliably prevent fused conductive wire 80 from being conducted again.

Further, support plate 28 has second protrusions 102. Second protrusions 102 each are arranged to be shifted from first protrusion 100 in the plane direction where support plate 28 extends, that is, in the XY plane direction, and protrude upward in the vertical direction from base plate 33. Non-fusible portions 98 adjacent to fusible portion 96 are placed on a tip of each second protrusion 102. Therefore, each low-resistance part 88 adjacent to high-resistance part 90 in conductive wire 80 is supported from below by second protrusion 102. Support plate 28 of the present exemplary embodiment has a pair of second protrusions 102, and non-fusible portions 98 on both outer sides of fusible portion 96 are supported from below.

By supporting non-fusible portions 98 adjacent to fusible portion 96 by each second protrusion 102, when fusible portion 96 is fused, it is possible to more reliably cause falling by their own weight of one end side and the other end side of the disconnected detection line main body 76. As a result, the one end side and the other end side can be more reliably moved away from each other, so that fused conductive wire 80 can be more reliably suppressed from being conducted again. Second protrusion 102 of the present exemplary embodiment has a protrusion height lower than a protrusion height of first protrusion 100. As a result, it is possible to more reliably cause falling by their own weight of the one end side and the other end side of the separated detection line main body 76.

In addition, cover plate 60 of the present exemplary embodiment has third protrusions 104. Each of third protrusions 104 protrudes downward in the vertical direction from base plate 61. A tip of third protrusion 104 pushes non-fusible portion 98 adjacent to fusible portion 96 toward support plate 28. Therefore, low-resistance part 88 adjacent to high-resistance part 90 of conductive wire 80 is pressed toward support plate 28 by third protrusion 104. Cover plate 60 of the present exemplary embodiment has a pair of third protrusions 104, and non-fusible portions 98 on both outer sides of fusible portion 96 are pressed toward support plate 28.

By pushing non-fusible portions 98 adjacent to fusible portion 96 downward in the vertical direction by each third protrusion 104, when fusible portion 96 is fused, it is possible to more reliably cause falling by their own weight of one end side and the other end side of the disconnected detection line main body 76. As a result, the one end side and the other end side can be more reliably moved away from each other, so that fused conductive wire 80 can be more reliably suppressed from being conducted again.

In addition, second protrusion 102 and third protrusion 104 are arranged to be shifted from each other in the plane direction where support plate 28 extends. A tip of second protrusion 102 protrudes toward cover plate 60 from a tip of third protrusion 104. Therefore, the tip of third protrusion 104 protrudes toward support plate 28 from the tip of second protrusion 102. Therefore, second protrusion 102 and third protrusion 104 overlap each other when viewed from a direction intersecting vertical direction Z in which support plate 28 and cover plate 60 are arranged. This makes it possible to suppress scattering of fragments of conductive wire 80 or insulating film 82 when fusible portion 96 is fused.

As described above, voltage detection lines 46 according to the present exemplary embodiment include conductive wires 80 and insulating films 82 covering the conductive wires 80. Conductive wires 80 include low-resistance parts 88 having a predetermined electrical resistance value, and high-resistance parts 90 having a higher electrical resistance value than an electrical resistance value of low-resistance parts 88 and fusing when an overcurrent flows through any of conductive wires 80. Insulating film 82 includes high-strength part 92 that covers low-resistance part 88 and has a predetermined strength, and low-strength part 94 that covers high-resistance part 90 and has a strength lower than a strength of high-strength part 92. As a result, when high-resistance part 90 is fused, insulating film 82 can be more reliably cut at the fused portion. As a result, it is possible to keep the one end side and the other end side of the disconnected conductive wire 80 away from each other to suppress reconduction of the fused conductive wire 80 and generation of arc discharge. Therefore, reconduction of the disconnected voltage detection line 46 can be suppressed, and safety of battery module 1 can be enhanced.

Voltage detection line 46 has first regions 84 extending in stacking direction X of batteries 14 and second regions 86 extending in a direction intersecting stacking direction X. High-resistance part 90 is disposed in each second region 86. As a result, when each bus bar 42 is displaced due to expansion or the like of each battery 14, second region 86 can be more easily displaced. As a result, the stability of the electrical connection between each bus bar 42 and voltage detection lines 46 can be enhanced, and the safety of battery module 1 can be further enhanced.

Voltage detection line module 47 of the present exemplary embodiment includes voltage detection lines 46 and support plate 28 that supports voltage detection lines 46. Support plate 28 includes first protrusions 100 that each support high-resistance part 90 from below. By supporting high-resistance part 90 by first protrusion 100, when high-resistance part 90 is fused, the one end side and the other end side of the disconnected conductive wire 80 can fall down by their own weight, and the one end side and the other end side of conductive wire 80 can be isolated by first protrusion 100. This makes it possible to more reliably suppress reconduction of the fused conductive wire 80 and generation of arc discharge.

In addition, support plate 28 of the present exemplary embodiment has second protrusions 102 that each supports low-resistance part 88 adjacent to high-resistance part 90 from below. As a result, when high-resistance part 90 is fused, the one end side and the other end side of the disconnected conductive wire 80 can be more reliably separated from each other. Therefore, the reconduction of the fused conductive wire 80 and the generation of the arc discharge can be more reliably suppressed. In addition, second protrusions 102 can suppress scattering of fragments of conductive wire 80 and insulating film 82 over a wide range when fusible portion 96 is fused.

Voltage detection line module 47 of the present exemplary embodiment includes cover plate 60 that is placed on support plate 28 and covers voltage detection lines 46. Cover plate 60 has third protrusions 104 that each push low-resistance part 88 adjacent to high-resistance part 90 toward support plate 28. As a result, when high-resistance part 90 is fused, the one end side and the other end side of the disconnected conductive wire 80 can be more reliably separated from each other. Therefore, the reconduction of the fused conductive wire 80 and the generation of the arc discharge can be more reliably suppressed. In addition, third protrusions 104 can suppress scattering of fragments of conductive wire 80 and insulating film 82 over a wide range when fusible portion 96 is fused.

In addition, in the present exemplary embodiment, second protrusions 102 and third protrusions 104 are arranged to be shifted from each other in the plane direction where support plate 28 extends, and a tip of each second protrusion 102 protrudes toward cover plate 60 from the tip of each third protrusion 104. As a result, a passage having a labyrinth structure can be formed in a space sandwiched between support plate 28 and cover plate 60. As a result, it is possible to more reliably suppress scattering of fragments of conductive wire 80 or insulating film 82 generated when fusible portion 96 is fused in a wide range. In the present exemplary embodiment, a pair of second protrusions 102 and a pair of third protrusions 104 are disposed respectively on each side of high-resistance part 90. Therefore, fragments of conductive wire 80 or insulating film 82 can be more reliably kept in a vicinity of fusible portion 96.

The exemplary embodiments of the present invention have been described in detail above. The above-described exemplary embodiment is merely a specific example for implementing the present invention. The contents of the exemplary embodiment do not limit the technical scope of the present invention, and many design changes such as changes, additions, and deletions of components can be made without departing from the spirit of the invention defined in the claims. Any new exemplary embodiment to which design change is made has an effect of each of the combined exemplary embodiment and modifications. In the above-described exemplary embodiment, with respect to the contents where such design changes are allowable, the contents are emphasized with expressions such as "of the present exemplary embodiment" and "in the present exemplary embodiment". However, design changes are allowed even with respect to the contents without such expressions. Any combination of constituent elements included in the exemplary embodiments is also effective as an aspect of the present invention. Hatching applied to the cross sections in the drawings does not limit materials of objects to which the hatching is applied.

Modified Example 1

Figure 6:
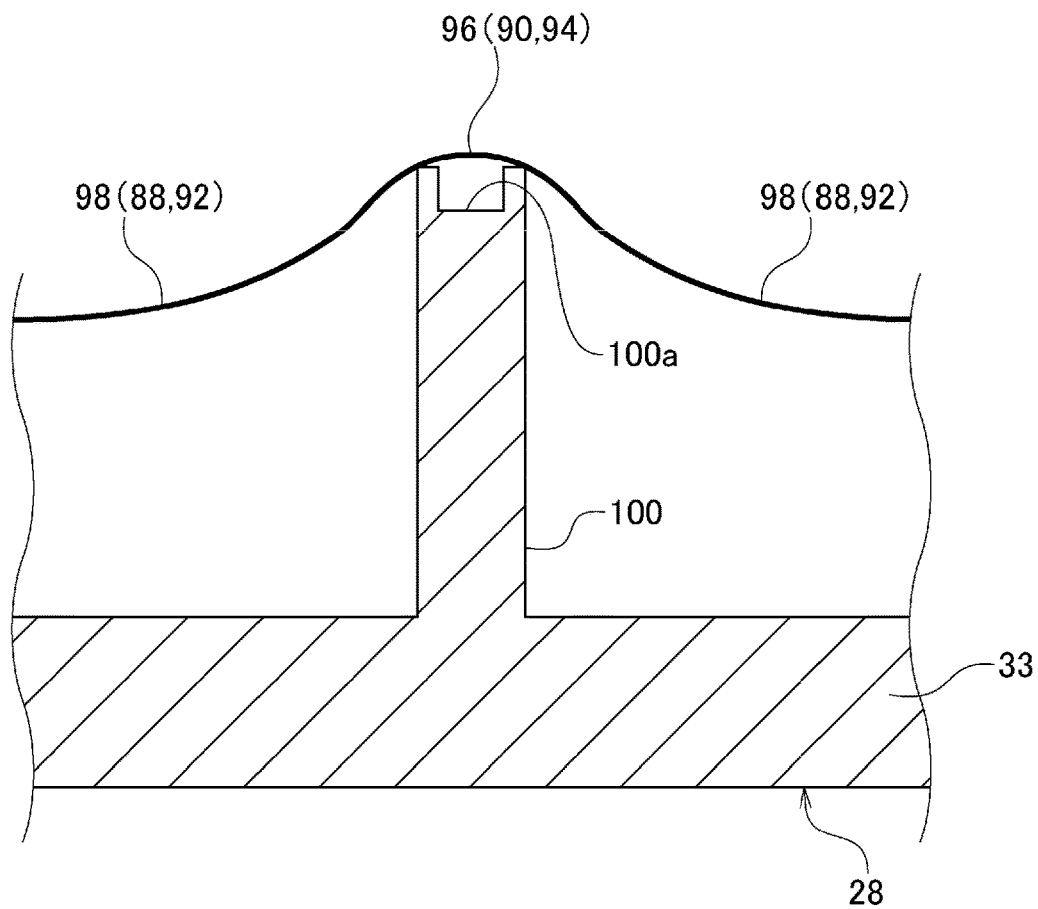
FIG. 6 is a cross-sectional view of a part of a voltage detection line module according to Modified Example 1.

FIG. 6 is a cross-sectional view of a part of voltage detection line module 47 according to Modification Example 1. Note that illustration of cover plate 60 is omitted in FIG. 6. In voltage detection line module 47 according to Modified Example 1, first protrusion 100 has recess 100a at a tip of the first protrusion. That is, a part of the tip of first protrusion 100 is recessed in a direction away from fusible portion 96 supported by first protrusion 100. In a state where fusible portion 96 is supported by first protrusion 100, a part of the tip of first protrusion 100 and fusible portion 96 are in a non-contact state in recess 100a. As a result, heat generated in fusible portion 96 is suppressed from being dissipated via first protrusion 100, and fusible portion 96 can be more reliably fused.

Modified Example 2

Figure 7:
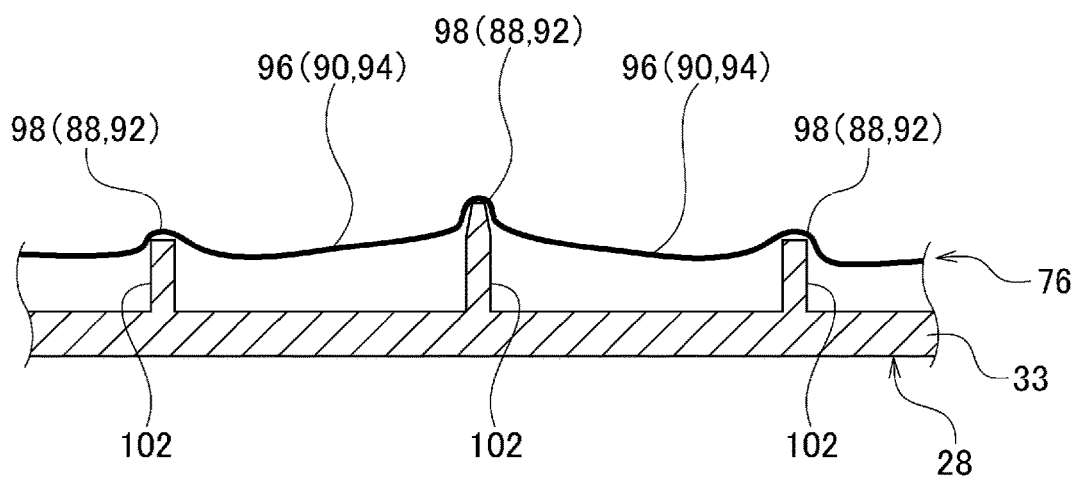
FIG. 7 is a cross-sectional view of a part of a voltage detection line module according to Modified Example 2.

FIG. 7 is a cross-sectional view of a part of voltage detection line module 47 according to Modified Example 2. Note that illustration of cover plate 60 is omitted in FIG. 7. In the exemplary embodiment, fusible portion 96 is supported from below by first protrusion 100, but the present invention is not particularly limited to this configuration. For example, in Modified Example 2, detection line main body 76 is supported only by the pair of second protrusions 102. Even with such a configuration, the one end side and the other end side of the separated detection line main body 76 can fall down by its own weight to move the one end side and the other end side away from each other. In Modified Example 2, detection line main body 76 has two fusible portions 96, and non-fusible portion 98 adjacent to each fusible portion 96 is supported by second protrusion 102.

Modified Example 3

Figure 8:
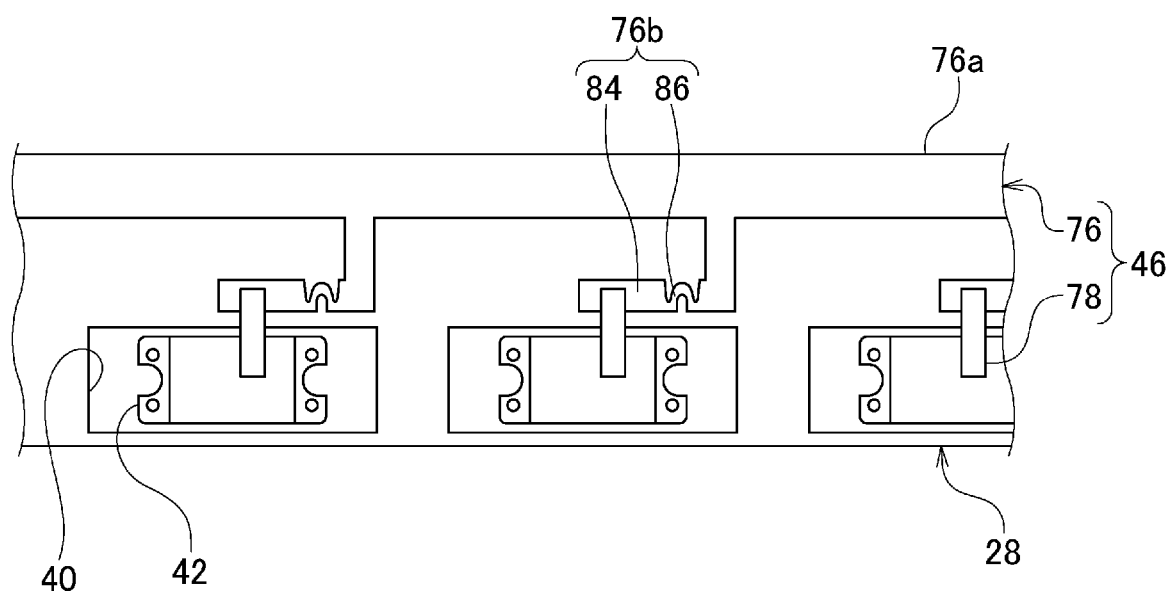
FIG. 8 is a plan view of a part of a battery module according to Modified Example 3.

FIG. 8 is a plan view of a part of battery module 1 according to Modified Example 3. In the exemplary embodiment, second region 86 is provided in stem 76a of detection line main body 76, but the present invention is not particularly limited to this configuration. For example, in Modified Example 3, second region 86 is provided in branch 76b. Branch 76b of Modification 3 has first region 84 extending in the stacking direction X of batteries 14 and second region 86 extending in a direction intersecting the stacking direction X. Even in such a configuration, second region 86 can be displaced following a displacement of bus bar 42 in stacking direction X. Therefore, the stability of electrical connection between each bus bar 42 and voltage detection line 46 can be enhanced. When second region 86 is provided in branch 76b, first region 84 is not necessarily provided in branch 76b. For example, branch 76b may have only a portion protruding linearly from stem 76a toward opening 40, and this portion may constitute second region 86.

However, in order to displace second region 86 following the displacement of bus bar 42 in stacking direction X, it is desirable that second region 86 provided in branch 76b be smoothly displaced in stacking direction X with respect to stem 76a of detection line main body 76. On the other hand, as illustrated in FIG. 8, by adopting a structure in which first region 84 is provided in branch 76b and second region 86 having a curved outer shape is provided in the middle of first region 84, second region 86 provided in branch 76b can be smoothly displaced with respect to stem 76a. Therefore, second region 86 can effectively follow the displacement of bus bar 42 in stacking direction X. In addition, second region 86 may be provided in both stem 76a and branch 76b.

OTHER EXAMPLES

In the exemplary embodiment, second protrusion 102 and third protrusion 104 are arranged to be shifted from each other, but the tip of second protrusion 102 and the tip of third protrusion 104 may be opposed to each other, and detection line main body 76 may be interposed between the two tips.

When an orientation of battery module 1 is determined such that cover plate 60 is positioned downward in a vertical direction and support plate 28 is positioned upward in the vertical direction, cover plate 60 can function as a support plate for voltage detection line 46, and support plate 28 can function as a cover plate. In this case, by providing first protrusion 100 on cover plate 60, fusible portion 96 can be supported from below by first protrusion 100. In addition, third protrusion 104 provided on cover plate 60 can function as second protrusion 102, and second protrusion 102 provided on support plate 28 can function as third protrusion 104.

The number of batteries 14 that battery module 1 includes is not particularly limited. A structure of each part of battery module 1 including a fastening structure of end plates 4 and constraining members 12 is not limited. Batteries 14 may have a cylindrical shape or the like.

The exemplary embodiments may be specified by the items described below.
[Item 1]
A battery module including: batteries 14; and voltage detection lines 46 having conductive wires 80 and insulating films 82, and configured to detect voltage of each of batteries 14. Each of conductive wires 80 includes low-resistance part 88 having a predetermined electrical resistance value, and high-resistance part 90 having a higher electrical resistance value than an electrical resistance value of low-resistance part 88 and fusing when an overcurrent flows through conductive wire 80. Each of insulating films 82 includes high-strength part 92 covering low-resistance part 88 and having a predetermined strength, and low-strength part 94 covering high-resistance part 90 and having a strength lower than a strength of high-strength part 92.

REFERENCE MARKS IN THE DRAWINGS 28 support plate
46 voltage detection line
47 voltage detection line module
60 cover plate
80 conductive wire
82 insulating film
84 first region
86 second region
88 low-resistance part
90 high-resistance part
92 high-strength part
94 low-strength part
100 first protrusion
102 second protrusion
104 third protrusion

The invention claimed is:

1. A voltage detection line for detecting a voltage of a battery, the voltage detection line comprising:
   a conductive wire; and
   an insulating film covering the conductive wire,
   wherein the conductive wire includes
      a low-resistance part including a predetermined electrical resistance value, and
      a high-resistance part including a higher electrical resistance value than an electrical resistance value of the low-resistance part and fusing when an overcurrent flows through the conductive wire,
   wherein the insulating film includes
      a high-strength part covering the low-resistance part and including a predetermined strength, and
      a low-strength part covering the high-resistance part and including a strength lower than a strength of the high-strength part, and
   wherein in a direction perpendicular to an axis of the conductive wire, a coating thickness of the low-strength part is smaller than a coating thickness of the high-strength part.

2. The voltage detection line according to claim 1, wherein
   the voltage detection line detects a voltage of each of a plurality of batteries stacked, the plurality of batteries each being the battery,
   wherein the voltage detection line includes
      a first region extending in a stacking direction of the batteries and
      a second region extending in a direction intersecting the stacking direction, and
   wherein the high-resistance part is disposed in the second region.

3. A voltage detection line module, comprising:
   the voltage detection line according to claim 1; and
   a support plate that supports the voltage detection line.

4. The voltage detection line module according to claim 3, wherein the support plate includes a first protrusion that supports the high-resistance part from below.

5. The voltage detection line module according to claim 4, wherein the first protrusion includes a recess at a tip of the first protrusion.

6. The voltage detection line module according to claim 3, wherein the support plate includes a second protrusion that supports the low-resistance part adjacent to the high-resistance part from below.

7. The voltage detection line module according to claim 6, wherein the support plate includes a pair of second protrusions each being the second protrusion, and the pair of the second protrusions supports low-resistance parts each being the low-resistance parts on both outer sides of the high-resistance part from below.

8. The voltage detection line module according to claim 3, wherein
the voltage detection line module includes a cover plate placed on the support plate and covering the voltage detection line, and
wherein the cover plate includes a third protrusion that pushes the low-resistance part adjacent to the high-resistance part toward the support plate.

9. The voltage detection line module according to claim 8, wherein
the support plate includes a second protrusion that supports the low-resistance part adjacent to the high-resistance part from below, and
wherein the second protrusion and the third protrusion are arranged to be shifted from each other in a plane direction that the support plate spreads, and a tip of the second protrusion protrudes toward the cover plate from a tip of the third protrusion.

10. A voltage detection line module, comprising:
a voltage detection line for detecting a voltage of a battery; and
a support plate that supports the voltage detection line, the voltage detection line comprising:
  a conductive wire; and
  an insulating film covering the conductive wire,
wherein the conductive wire includes
  a low-resistance part including a predetermined electrical resistance value, and
  a high-resistance part including a higher electrical resistance value than an electrical resistance value of the low-resistance part and fusing when an overcurrent flows through the conductive wire,
wherein the insulating film includes
  a high-strength part covering the low-resistance part and including a predetermined strength, and
  a low-strength part covering the high-resistance part and including a strength lower than a strength of the high-strength part, and
wherein the support plate includes a first protrusion that supports the high-resistance part from below.

11. The voltage detection line module according to claim 10, wherein
the voltage detection line detects a voltage of each of a plurality of batteries stacked, the plurality of batteries each being the battery,
wherein the voltage detection line includes
  a first region extending in a stacking direction of the batteries and
  a second region extending in a direction intersecting the stacking direction, and
wherein the high-resistance part is disposed in the second region.

12. The voltage detection line module according to claim 10, wherein the first protrusion includes a recess at a tip of the first protrusion.

13. The voltage detection line module according to claim 10, wherein
the voltage detection line module includes a cover plate placed on the support plate and covering the voltage detection line, and
wherein the cover plate includes a third protrusion that pushes the low-resistance part adjacent to the high-resistance part toward the support plate.

14. The voltage detection line module according to claim 13, wherein
the support plate includes a second protrusion that supports the low-resistance part adjacent to the high-resistance part from below, and
wherein the second protrusion and the third protrusion are arranged to be shifted from each other in a plane direction that the support plate spreads, and a tip of the second protrusion protrudes toward the cover plate from a tip of the third protrusion.

15. A voltage detection line module, comprising:
a voltage detection line for detecting a voltage of a battery; and
a support plate that supports the voltage detection line, the voltage detection line comprising:
  a conductive wire; and
  an insulating film covering the conductive wire,
wherein the conductive wire includes
  a low-resistance part including a predetermined electrical resistance value, and
  a high-resistance part including a higher electrical resistance value than an electrical resistance value of the low-resistance part and fusing when an overcurrent flows through the conductive wire,
wherein the insulating film includes
  a high-strength part covering the low-resistance part and including a predetermined strength, and
  a low-strength part covering the high-resistance part and including a strength lower than a strength of the high-strength part, and
wherein the support plate includes a second protrusion that supports the low-resistance part adjacent to the high-resistance part from below.

16. The voltage detection line module according to claim 15, wherein
the voltage detection line detects a voltage of each of a plurality of batteries stacked, the plurality of batteries each being the battery,
wherein the voltage detection line includes
  a first region extending in a stacking direction of the batteries and
  a second region extending in a direction intersecting the stacking direction, and
wherein the high-resistance part is disposed in the second region.

17. The voltage detection line module according to claim 15, wherein
the support plate includes a pair of second protrusions each being the second protrusion, and the pair of the second protrusions supports low-resistance parts each being the low-resistance parts on both outer sides of the high-resistance part from below.

18. The voltage detection line module according to claim 15, wherein
the voltage detection line module includes a cover plate placed on the support plate and covering the voltage detection line, and
wherein the cover plate includes a third protrusion that pushes the low-resistance part adjacent to the high-resistance part toward the support plate.

19. The voltage detection line module according to claim 18, wherein
wherein the second protrusion and the third protrusion are arranged to be shifted from each other in a plane direction that the support plate spreads, and a tip of the second protrusion protrudes toward the cover plate from a tip of the third protrusion.

* * * * *